US012677635B2

(12) United States Patent
Inoue et al.

(10) Patent No.: US 12,677,635 B2
(45) Date of Patent: Jul. 7, 2026

(54) MEMBER FOR SEMICONDUCTOR MANUFACTURING APPARATUS

(71) Applicant: NGK Insulators, Ltd., Nagoya-City (JP)

(72) Inventors: Seiya Inoue, Handa-City (JP); Tatsuya Kuno, Nagoya-City (JP); Tomoki Nagae, Nagoya-City (JP); Yusuke Ogiso, Nagakute-City (JP); Takuya Yoto, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 680 days.

(21) Appl. No.: 18/052,589

(22) Filed: Nov. 4, 2022

(65) Prior Publication Data

US 2023/0298861 A1 Sep. 21, 2023

(30) Foreign Application Priority Data

Jan. 21, 2022 (JP) ................................. 2022-007944

(51) Int. Cl.
*H10P 72/72* (2026.01)
*H10P 72/00* (2026.01)
*H10P 72/76* (2026.01)

(52) U.S. Cl.
CPC ........ *H10P 72/722* (2026.01); *H10P 72/0432* (2026.01); *H10P 72/7624* (2026.01)

(58) Field of Classification Search
CPC ......... H01L 21/68785; H01L 21/67103; H01L 21/6833
See application file for complete search history.

(56) References Cited

U.S. PATENT DOCUMENTS

| | | | |
|---|---|---|---|
| 2016/0111315 A1* | 4/2016 | Parkhe | .............. H01L 21/68785 361/234 |
| 2019/0035667 A1 | 1/2019 | Minemura | |
| 2019/0252231 A1 | 8/2019 | Takasaki | |

(Continued)

FOREIGN PATENT DOCUMENTS

| | | |
|---|---|---|
| JP | 2018-101773 A | 6/2018 |
| JP | 2019-029384 A | 2/2019 |

(Continued)

OTHER PUBLICATIONS

KR-20200106827-A PE2E Translation (Year: 2020).*

(Continued)

*Primary Examiner* — Sunil K Singh
*Assistant Examiner* — Dustin James Trujillo
(74) *Attorney, Agent, or Firm* — Muncy, Geissler, Olds & Lowe, P.C.

(57) ABSTRACT

A member for semiconductor manufacturing apparatus includes: a ceramic plate having a wafer placement surface on its upper surface; and a porous plug that is disposed in a plug insertion hole penetrating the ceramic plate in a up-down direction, and allows a gas to flow, wherein the porous plug has a first porous member exposed to the wafer placement surface, and a second porous member having an upper surface covered by the first porous member, the first porous member is higher in purity and smaller in thickness than the second porous member, and the second porous member is higher in porosity than the first porous member.

10 Claims, 8 Drawing Sheets

(56)            References Cited

U.S. PATENT DOCUMENTS

| | | |
|---|---|---|
| 2019/0287839 A1 | 9/2019 | Yamaguchi et al. |
| 2020/0294838 A1 | 9/2020 | Yoshikawa et al. |
| 2021/0118716 A1 | 4/2021 | Ye et al. |

FOREIGN PATENT DOCUMENTS

| | | | | | |
|---|---|---|---|---|---|
| KR | 10-2019-0108481 A | | 9/2019 | | |
| KR | 10-2020-0109253 A | | 9/2020 | | |
| KR | 20200106827 A | * | 9/2020 | | |
| TW | 202025414 A | * | 7/2020 | .......... | F28D 1/0233 |
| TW | 202117844 A | | 5/2021 | | |
| WO | 2019/009028 A1 | | 1/2019 | | |

OTHER PUBLICATIONS

TW-202025414-A PE2E Translation (Year: 2020).*
Taiwanese Office Action (Application No. 111142368) dated Oct.
12, 2023 (5 pages).
Korean Office Action (Application No. 10-2022-0145086) dated
Apr. 12, 2024 (with English translation) (13 pages).

* cited by examiner 150
151
152

550
551
552

250
251
252
E 650
651
652
E 350
351
352

750
751
752

450
451
452
E

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

In a known member for semiconductor manufacturing apparatus in the related art, an electrostatic chuck having a wafer placement surface on its upper surface is provided. For example, the member for semiconductor manufacturing apparatus in PTL 1 includes: a ceramic plate that absorbs and holds a wafer; a through-hole formed in the ceramic plate; a porous plug disposed in the through-hole; and a conductive cooling plate bonded to a lower surface of the ceramic plate. The lower surface of the porous plug conforms the lower surface of the ceramic plate. When a wafer placed on the wafer placement surface is processed by plasma, high-frequency power is applied across a cooling plate and a flat plate electrode disposed at an upper portion of the wafer to generate a plasma at the upper portion. Along with this, in order to improve heat transfer between the wafer and the ceramic plate, helium serving as a heat transfer gas is supplied to the rear surface of the wafer through the porous plug. When no porous plug is provided, arc discharge occurs when electrons generated due to ionization of helium are accelerated to collide with other helium, whereas when a porous plug is provided, the electrons collide with the porous plug before colliding with other helium, thus arc discharge is prevented.

CITATION LIST

Patent Literature

PTL 1: Japanese Unexamined Patent Application Publication No. 2019-29384

SUMMARY OF THE INVENTION

However, the porous plug is exposed to the wafer placement surface, thus if the purity of the porous plug is low, impurities in the porous plug may be mixed into a wafer when the wafer is processed with plasma. In contrast, if the purity of the porous plug is high, a sintering temperature needs to be raised, thus it is difficult to achieve a sufficiently high porosity, and helium is unlikely to flow.

The present invention has been devised to address such a problem, and it is a main object to prevent mixture of impurities into a wafer as well as increase in flow resistance of a gas in a member for semiconductor manufacturing apparatus, including a porous plug that allows a gas to flow.

A member for semiconductor manufacturing apparatus of the present invention includes: a ceramic plate having a wafer placement surface on its upper surface; and a porous plug that is disposed in a plug insertion hole penetrating the ceramic plate in a up-down direction, and allows a gas to flow. The porous plug has a first porous member exposed to the wafer placement surface, and a second porous member having an upper surface covered by the first porous member, the first porous member is higher in purity and smaller in thickness than the second porous member, and the second porous member is higher in porosity than the first porous member.

In the member for semiconductor manufacturing apparatus, the first porous member exposed to the wafer placement surface is higher in purity than the second porous member. Thus, occurrence of mixture of impurities into a wafer can be reduced. In contrast, the second porous member is higher in porosity than the first porous member. The first porous member is lower in porosity than the second porous member, but is thinner than the second porous member. Thus, in view of the whole porous plug, increase in flow resistance of a gas can be prevented.

Note that in the present specification, the present invention may be described using up and down, right and left, and front and back; however up and down, right and left, and front and back merely indicate a relative positional relationship. Thus, when the orientation of the member for semiconductor manufacturing apparatus is changed, up and down may change to right and left, or right and left may change to up and down, and such a case is also included in the technical scope of the present invention.

In the member for semiconductor manufacturing apparatus of the present invention, the first porous member may be a thermal spray film. In this configuration, the first porous member can be produced relatively easily.

In the member for semiconductor manufacturing apparatus of the present invention, the plug insertion hole may have a female thread portion on an inner peripheral surface, and the porous plug may have a male thread portion to be screwed into the female thread portion, on an outer peripheral surface. In this configuration, the porous plug can be disposed in the plug insertion hole without using a bonding adhesive. Furthermore, in an area where the male thread portion is screwed into the female thread portion, a gap in an up-down direction is unlikely to occur and a creepage distance is increased, as compared to when no thread is provided. Thus, electrical discharge can be sufficiently prevented in the area. The male thread portion may be provided on the outer peripheral surface of the second porous member, may be provided on the outer peripheral surface of the first porous member, or may be provided on the outer peripheral surfaces of the first and second porous members.

In the member for semiconductor manufacturing apparatus of the present invention, the first porous member may have an inverted circular truncated cone shape with an upper base larger than a lower base. In this configuration, as compared to when the first porous member is in a cylindrical shape, a material is easily filled in the plug insertion hole when the first porous member is formed, and the contact area between the first porous member and the plug insertion hole is increased, thus the adhesiveness between the first porous member and the plug insertion hole is improved.

In the member for semiconductor manufacturing apparatus of the present invention, the second porous member may have an enlarged-diameter section a diameter of which increases downward from top. In this configuration, the porous plug can be prevented from floating due to the pressure of a gas supplied from the lower surface of the porous plug.

The member for semiconductor manufacturing apparatus of the present invention may further include: a conductive substrate provided in a lower surface of the ceramic plate; and a communication hole provided in the conductive substrate to communicate with the porous plug. A lower surface of the second porous member may be located inside the communication hole. In this configuration, it is possible to prevent arc discharge from occurring between the lower surface of the porous plug and the conductive substrate.

In the member for semiconductor manufacturing apparatus of the present invention, the wafer placement surface may have a large number of small projections that support a wafer, and an upper surface of the first porous member of the porous plug may be located at a position lower than an upper surface of the small projections. In this configuration, the wafer is not lifted by the upper surface of the first porous member. In this case, the upper surface of the first porous member of the porous plug may be at a same height as or at a position lower than a reference surface of the wafer placement surface, in a range of 0.5 mm or less, the reference surface being not provided with the small projections. In this configuration, the height of the space between the rear surface of the wafer and the upper surface of the first porous member is maintained at a low level, thus it is possible to prevent arc discharge from occurring in the space. Note that the height of a reference surface may vary by small projection. The height of a reference surface may be the same as the height of the bottom surface of a small projection closest to the plug insertion hole.

DETAILED DESCRIPTION OF THE INVENTION

Figure 1:
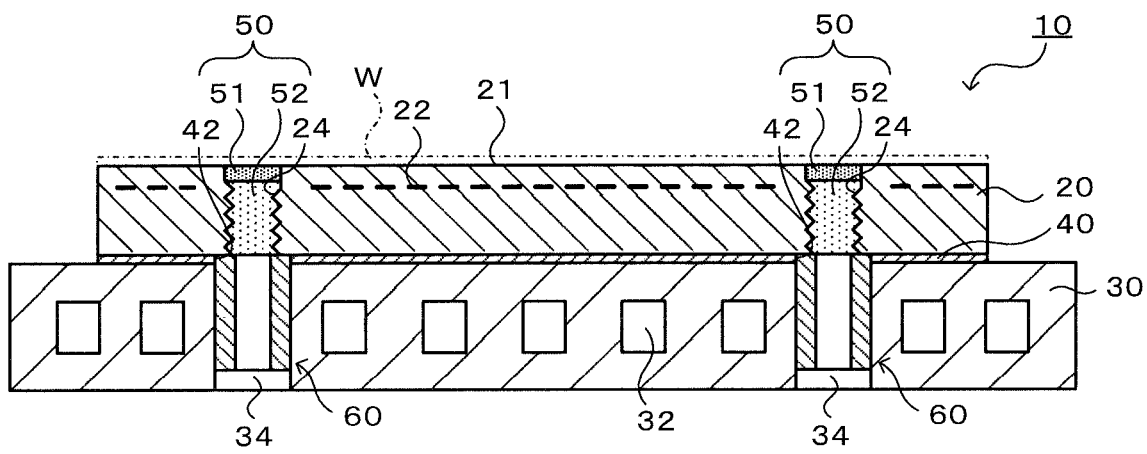
FIG. 1 is a vertical cross-sectional view of a member 10 for semiconductor manufacturing apparatus.
Figure 2:
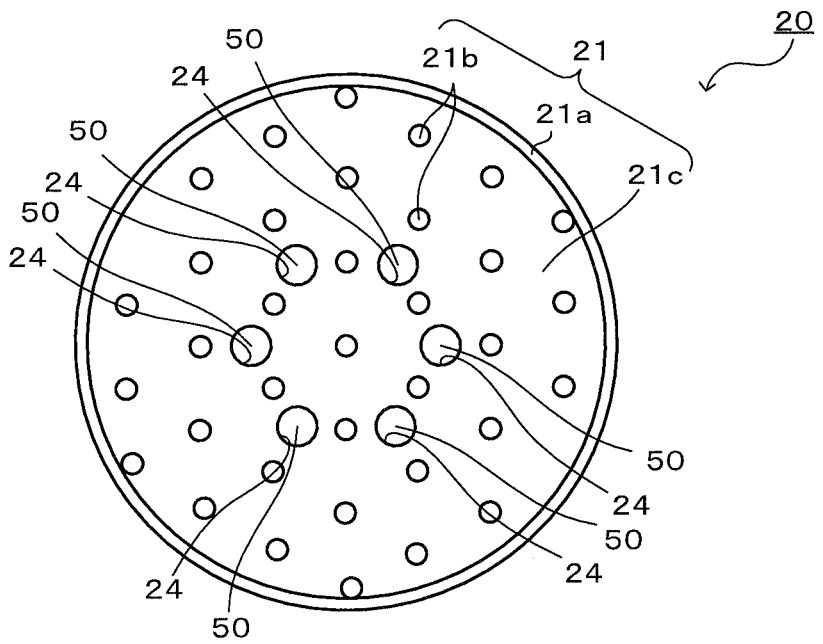
FIG. 2 is a plan view of a ceramic plate 20.
Figure 3:
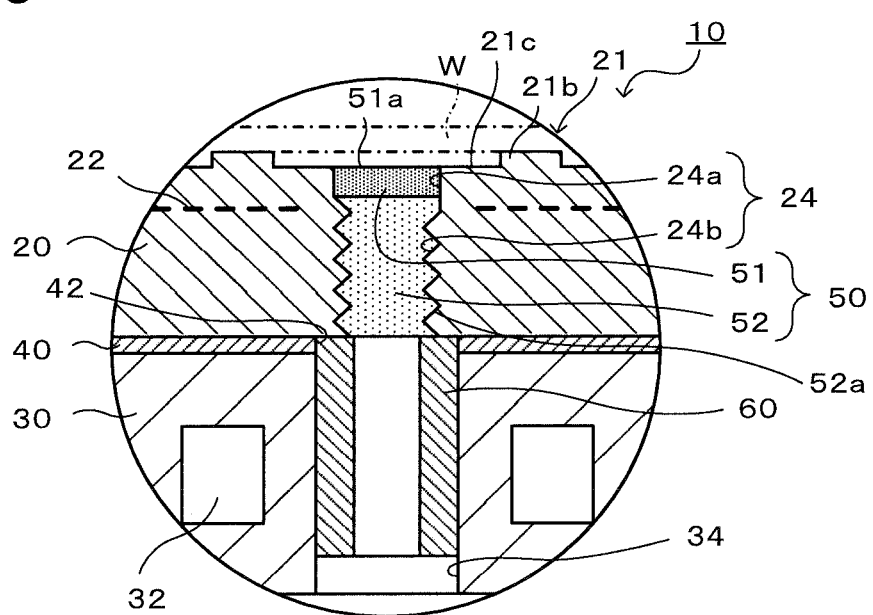
FIG. 3 is a partially enlarged view of FIG. 1.

Next, a preferred embodiment of the present invention will be described with reference to the drawings. FIG. 1 is a vertical cross-sectional view of a member 10 for semiconductor manufacturing apparatus, FIG. 2 is a plan view of a ceramic plate 20, and FIG. 3 is a partially enlarged view of FIG. 1.

The member 10 for semiconductor manufacturing apparatus includes a ceramic plate 20, a cooling plate 30, a metal joining layer 40, a porous plug 50, and an insulating pipe 60.

The ceramic plate 20 is a circular plate (for example, a diameter of 300 mm, a thickness of 5 mm) made of ceramic such as an alumina sintered body and an aluminum nitride sintered body. The upper surface of the ceramic plate 20 is a wafer placement surface 21. An electrode 22 is embedded in the ceramic plate 20. As illustrated in FIG. 2, on the wafer placement surface 21 of the ceramic plate 20, a seal band 21*a* is formed along the outer edge, and a plurality of small circular projections 21*b* are formed on the entire surface. The seal band 21*a* and the small circular projections 21*b* have the same height, which is several μm to several tens μm. The electrode 22 is a planar mesh electrode that is used as an electrostatic electrode, and a DC voltage can be applied thereto. When a DC voltage is applied to the electrode 22, a wafer W is absorbed and fixed to the wafer placement surface 21 (specifically, the upper surface of the seal band 21*a* and the upper surfaces of the small circular projections 21*b*) by an electrostatic adsorption force, and when application of the DC voltage is released, the adsorption and fixation of the wafer W to the wafer placement surface 21 is released. Note that the area of the wafer placement surface 21, which is not provided with the seal band 21*a* and the small circular projections 21*b*, is referred to as a reference surface 21*c*.

The plug insertion hole 24 is a through-hole that penetrates the ceramic plate 20 in a up-down direction. As illustrated in FIG. 3, the upper portion of the plug insertion hole 24 is a cylindrical member 24*a* without a female thread portion, and the lower portion is a female thread portion 24*b*. Multiple sections (for example, multiple sections provided at regular intervals in a circumferential direction as illustrated in FIG. 2) of the ceramic plate 20 are each provided with the plug insertion hole 24. The later-described porous plug 50 is disposed in the plug insertion hole 24.

The cooling plate 30 is a circular plate (circular plate with a diameter equal to or larger than the diameter of the ceramic plate 20) having a favorable thermal conductivity. A refrigerant flow path 32 through which a refrigerant circulates and a gas hole 34 for supplying a gas to the porous plug 50 are formed inside the cooling plate 30. The refrigerant flow path 32 is formed in the entirety of the cooling plate 30 in a plan view from an entrance to an exit in a one-stroke pattern. The gas hole 34 is a hole in a cylindrical shape, and is provided at a position opposed to the plug insertion hole 24. The material for the cooling plate 30 includes, for example, a metal material and a metal matrix composite (MMC). The metal material includes Al, Ti, Mo or an alloy of these. The MMC includes a material containing Si, SiC and Ti (also referred to as SisiCTi) and a material obtained by impregnating a SiC porous body with Al and/or Si. As the material for the cooling plate 30, it is preferable to select a material with a thermal expansion coefficient closer to that of the material for the ceramic plate 20. The cooling plate 30 is also used as an RF electrode. Specifically, an upper electrode (not illustrated) is disposed above the wafer placement surface 21, and when high-frequency power is applied to parallel plate electrodes comprised of the upper electrode and the cooling plate 30, a plasma is generated.

The metal joining layer 40 joins the lower surface of the ceramic plate 20 to the upper surface of the cooling plate 30. The metal joining layer 40 is formed, for example, by thermal compression bonding (TCB). The TCB is a publicly known method in which a metal joining material is inserted between two members to be joined, and the two members are pressure-bonded with heated at a temperature lower than or equal to the solidus temperature of the metal joining material. The metal joining layer 40 has a circular hole 42 penetrating the metal joining layer 40 in a up-down direction at a position opposed to the gas hole 34. The metal joining layer 40 and the cooling plate 30 of this embodiment correspond to the conductive substrate of the present invention, and the circular hole 42 and the gas hole 34 correspond to the communication hole.

The porous plug 50 is a plug that allows a gas to flow, and is disposed in the plug insertion hole 24. The outer peripheral surface of the porous plug 50 conforms (is in contact with) the inner peripheral surface of the plug insertion hole 24. The porous plug 50 has a structure in which a first porous member 51 forming an upper portion and a second porous member 52 forming a lower portion are connected. The first porous member 51 is exposed to the wafer placement surface 21 at an upper surface, and is higher in purity and smaller in thickness than the second porous member 52. The second porous member 52 has an upper surface covered by the first porous member 51, and is higher in porosity than the first porous member 51. As the first porous member 51 and the second porous member 52, materials with the same type and different purities or materials with different types and different purities may be used. When ceramic is used as the material, for example, alumina and aluminum nitride may be used. When alumina is used, alumina with a purity of 95% or more may be used for the first porous member 51, or alumina with a purity of 80% or more and less than the purity of the first porous member 51 may be used for the second porous member 52. The first porous member 51 preferably has a porosity of 15% or more and less than the porosity of the second porous member 52, and preferably has an average pore diameter of 5 μm or more. The film thickness of the first porous member 51 is preferably 1 mm or less, and more preferably 0.5 mm or less. The second porous member 52 preferably has a porosity of 30% or more, and preferably has an average pore diameter of 20 μm or more. The first porous member 51 is in a circular plate shape, has no male thread portion on the outer peripheral surface. The second porous member 52 is in a circular cylindrical shape, and has a male thread portion 52a on the outer peripheral surface. The male thread portion 52a is screwed into the female thread portion 24b of the plug insertion hole 24. The height of the porous plug 50 is the same as the thickness of the ceramic plate 20. The lower surface of the second porous member 52 of the porous plug 50 conforms the lower surface of the ceramic plate 20. In this embodiment, the first porous member 51 is a thermal spray film, and the second porous member 52 is a porous bulk body obtained by sintering using ceramic powder.

The insulating pipe 60 is a circular pipe in a plan view composed of dense ceramic (such as dense alumina). The outer peripheral surface of the insulating pipe 60 is bonded to the inner peripheral surface of the circular hole 42 of the metal joining layer 40 and the inner peripheral surface of the gas hole 34 of the cooling plate 30 via an adhesive layer which is not illustrated. The adhesive layer may be an organic adhesive layer (resin adhesive layer), or an inorganic adhesive layer. Note that the adhesive layer may be further provided between the upper surface of the insulating pipe 60 and the lower surface of the ceramic plate 20. The inside of the insulating pipe 60 communicates with the porous plug 50. Therefore, when a gas is introduced to the inside of the insulating pipe 60, the gas is supplied to the rear surface of the wafer W through the porous plug 50.

Next, an example of use of thus configured member 10 for semiconductor manufacturing apparatus will be described. First, a wafer W is placed on the wafer placement surface 21 with the member 10 for semiconductor manufacturing apparatus installed in a chamber which is not illustrated. The pressure in the chamber is then reduced and adjusted by a vacuum pump to achieve a predetermined degree of vacuum, and a DC voltage is applied to the electrode 22 of the ceramic plate 20 to generate an electrostatic adsorption force and cause the wafer W to be absorbed and fixed to the wafer placement surface 21 (specifically, the upper surface of the seal band 21a and the upper surfaces of the small circular projections 21b). Next, a reactive gas atmosphere with a predetermined pressure (for example, several 10s to several 100s of Pa) is formed in the chamber, and in this state, a high-frequency voltage is applied across an upper electrode (not illustrated) provided in a ceiling portion in the chamber and the cooling plate 30 of the member 10 for semiconductor manufacturing apparatus to generate a plasma. The surface of the wafer W is processed by the generated plasma. A refrigerant is circulated through the refrigerant flow path 32 of the cooling plate 30. A back side gas is introduced into the gas hole 34 from a gas cylinder which is not illustrated. A heat transfer gas (for example, helium) is used as the back side gas. The back side gas is supplied and enclosed in the space between the rear surface of the wafer W and the reference surface 21c of the wafer placement surface 21 through the insulating pipe 60 and the porous plug 50. Heat is efficiently transferred between the wafer W and the ceramic plate 20 due to the presence of the back side gas.

Figure 4A:
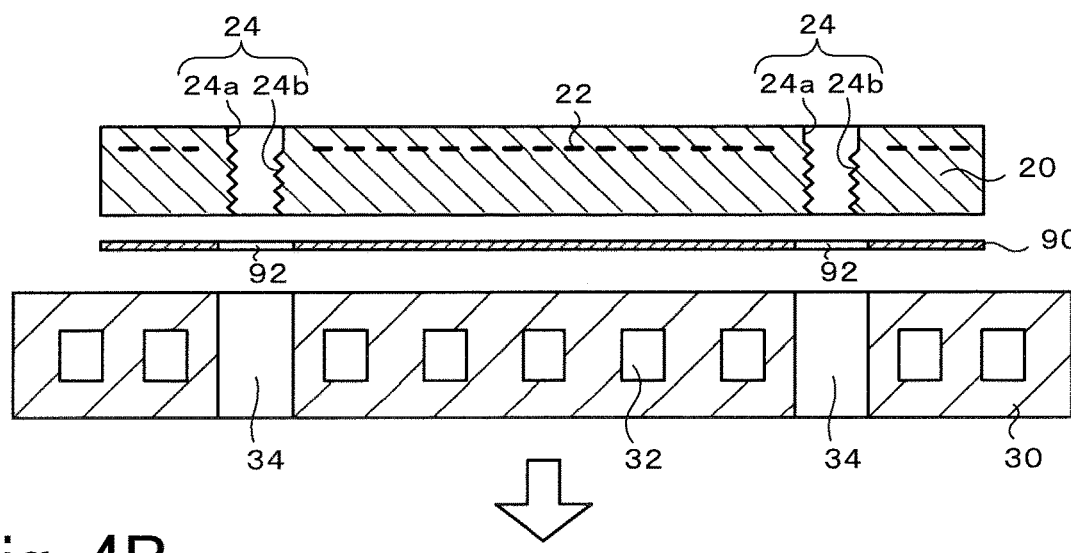
FIGS. 4A to 4C are manufacturing process diagrams of the member 10 for semiconductor manufacturing apparatus.

Next, a manufacturing example of the member 10 for semiconductor manufacturing apparatus will be described with reference to FIGS. 4A to 4C and FIGS. 5A to 5D. FIGS. 4A to 4C and FIGS. 5A to 5D are manufacturing process diagrams of the member 10 for semiconductor manufacturing apparatus. First, the ceramic plate 20, the cooling plate 30 and a metal joining material 90 are prepared (FIG. 4A). The ceramic plate 20 includes the electrode 22 and the plug insertion hole 24. In this stage, the upper surface of the ceramic plate 20 is a flat surface, and is not provided with any seal band 21a and any small circular projection 21b. The upper portion of the plug insertion hole 24 forms the cylindrical member 24a without a female thread portion, and the lower portion forms the female thread portion 24b. The cooling plate 30 has the embedded refrigerant flow path 32, and includes the gas hole 34. The metal joining material 90 includes a circular hole 92 that is to finally become the circular hole 42.

Figure 4B:
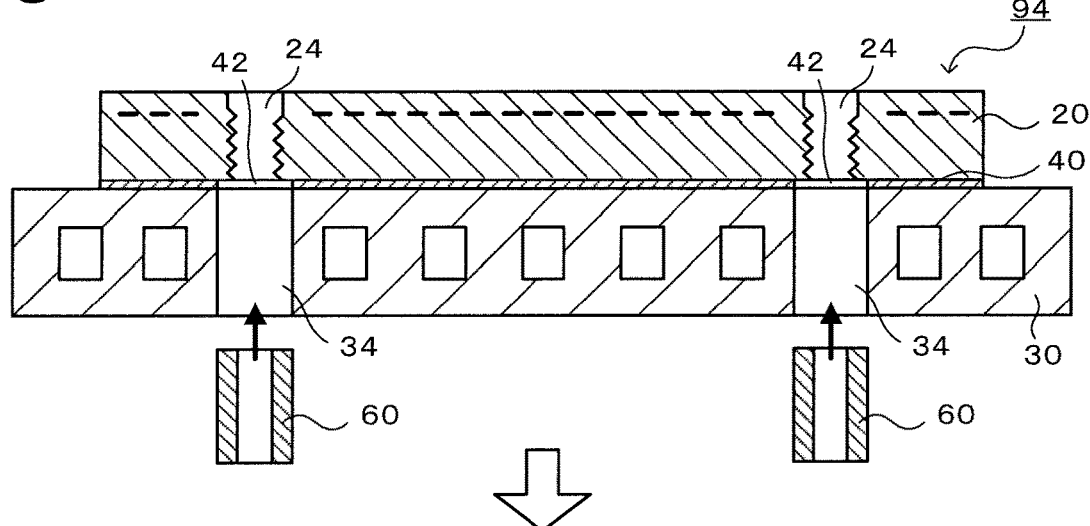

The lower surface of the ceramic plate 20 and the upper surface of the cooling plate 30 are joined by TCB to obtain a joined body 94 (FIG. 4B). The TCB is performed, for example, as follows. First, the metal joining material 90 is inserted between the lower surface of the ceramic plate 20 and the upper surface of the cooling plate 30 to form a layered body. In this process, the plug insertion hole 24 of the ceramic plate 20, the circular hole 92 of the metal joining material 90, and the gas hole 34 of the cooling plate 30 are coaxially stacked. The layered body is pressurized at a temperature (for example, a temperature in a range from the solidus temperature minus 20° C. to the solidus temperature) lower than or equal to the solidus temperature of the metal joining material 90 to be joined, then is placed at a room temperature. Thus, the metal joining material 90 becomes the metal joining layer 40, the circular hole 92 becomes the circular hole 42, and the joined body 94 is obtained in which the ceramic plate 20 and the cooling plate 30 are joined by the metal joining layer 40. As the metal joining material, an Al—Mg based joining material and an Al—Si—Mg based joining material may be used. For example, when the TCB is performed using an Al—Si—Mg based joining material, the layered body is pressurized in a heated state in a vacuum atmosphere. A metal joining material 90 with a thickness of approximately 100 μm is preferably used.

Figure 4C:
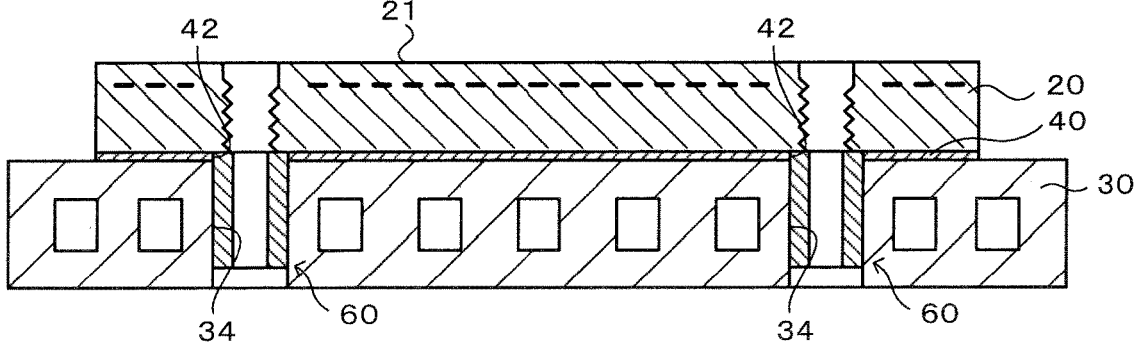

Subsequently, the insulating pipe 60 is prepared, and after a bonding adhesive is applied to the inner peripheral surface of the circular hole 42 of the metal joining layer 40 and the inner peripheral surface of the gas hole 34 of the cooling plate 30, the insulating pipe 60 is inserted into those holes, and bonded and fixed to the circular hole 42 and the gas hole 34 (FIG. 4C). The bonding adhesive may be a resin (organic) bonding adhesive, or an inorganic bonding adhesive. Subsequently, blasting is performed on the upper surface (the wafer placement surface 21) of the ceramic plate 20 to form the seal band 21a, the small circular projections 21b and the reference surface 21c (see FIG. 3).

Figures 5A, 5B, 5C, 5D:
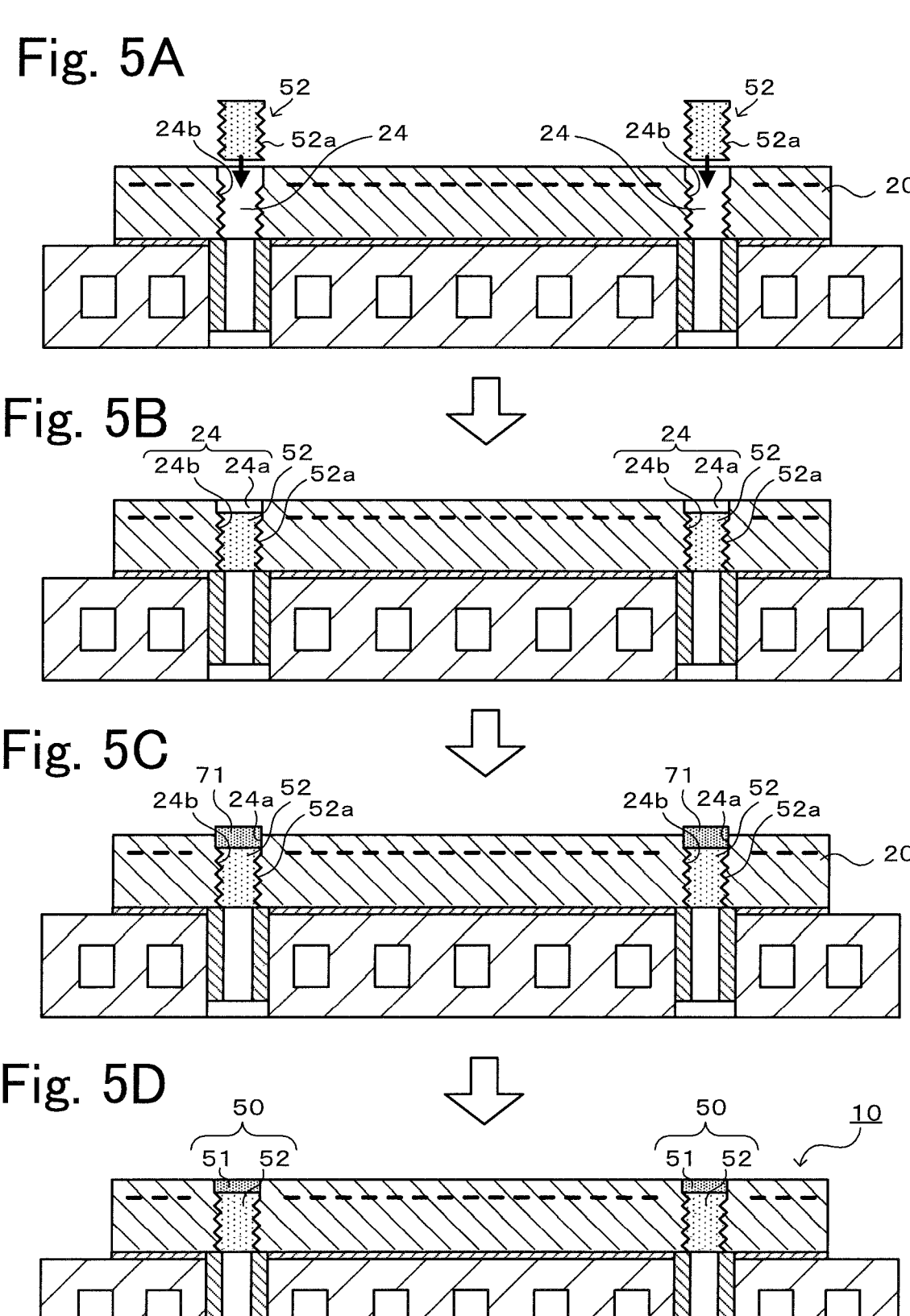
FIGS. 5A to 5D are manufacturing process diagrams of the member 10 for semiconductor manufacturing apparatus.

Subsequently, the second porous member 52 (porous bulk body) including the male thread portion 52a is prepared (FIG. 5A). As the second porous member 52, a porous material produced in the following manner may be used: a pore-forming agent and/or a sintering aid agent (for example, $SiO_2$) is added to a ceramic material having a low purity (for example, a purity of 85% or 90%), which is molded into a cylindrical body having a male thread portion, then the cylindrical body is sintered at a relatively low temperature, thereby producing a porous material. When a pore-forming agent is used, it burns and vanishes at the time of sintering. Because a ceramic material having a low purity is used here, a sintering temperature can be relatively low, and the porosity can be increased. When a sintering aid agent is used, the component thereof causes impurities. Note that the second porous member 52 may be produced by sintering a porous flat plate-shaped molded body, cutting out cylindrical bodies therefrom, and threading the outer peripheral surfaces of the obtained cylindrical bodies.

The male thread portion 52a of the second porous member 52 is screwed into the female thread portion 24b of the plug insertion hole 24 so that the lower surface of the second porous member 52 conforms the upper surface (the lower surface of the ceramic plate 20) of the insulation pipe 60 (FIG. 5B). For example, a knob having, at a leading end, a material with a high friction coefficient, such as rubber, is brought into firm contact with the upper surface of the second porous member 52, the knob is rotated while being pushed by a hand, and the second porous member 52 is inserted and screwed into the plug insertion hole 24 through an upper opening thereof. After being screwed thereinto, the knob is removed.

Subsequently, a thermal spray film 71 is formed by spraying ceramic powder having a high purity (for example, a purity of 95% or more) to the upper surface of the second porous member 52 (FIG. 5C). Thus, the cylindrical member 24a of the plug insertion hole 24 is filled with the thermal spray film 71. At this point, the male thread portion 52a of the second porous member 52 has been screwed into the female thread portion 24b of the plug insertion hole 24, and no gap in an up-down direction has occurred, thus ceramic powder can be sprayed easily. The upper surface of the thermal spray film 71 is raised higher than the upper surface of the ceramic plate 20. Note that at the time of thermal spraying, a pore-forming agent may be added to ceramic powder so that the porosity of the thermal spray film 71 reaches a desired value.

Subsequently, grinding process (machining process) is performed so that the upper surface of the thermal spray film 71 is flush with the reference surface 21c (see FIG. 3) formed on the wafer placement surface 21 of the ceramic plate 20 (FIG. 5D). Consequently, the porous plug 50 is formed that includes the first porous member 51 composed of a thermal spray film at an upper portion and the second porous member 52 composed of a porous bulk body at a lower portion. The member 10 for semiconductor manufacturing apparatus is obtained as described above.

In the member 10 for semiconductor manufacturing apparatus described in detail above, the first porous member 51 exposed to the wafer placement surface 21 is higher in purity than the second porous member 52. Therefore, it is possible to prevent mixture of impurities from the porous plug 50 into the wafer W. In contrast, the second porous member 52 is higher in porosity than the first porous member 51. The first porous member 51 is lower in porosity than the second porous member 52, but is thinner than the second porous member 52. Thus, in view of the whole porous plug 50, increase in flow resistance of a heat transfer gas can be prevented.

In addition, since the first porous member 51 is a thermal spray film, the first porous member 51 can be produced relatively easily.

Furthermore, the plug insertion hole 24 has the female thread portion 24b on the inner peripheral surface, the second porous member 52 has the male thread portion 52a on the outer peripheral surface, and the female thread portion 24b is screwed into the male thread portion 52a. Therefore, the second porous member 52 can be disposed in the plug insertion hole 24 without using a bonding adhesive.

Furthermore, in an area where the male thread portion 52a is screwed into the female thread portion 24b, a gap in an up-down direction is unlikely to occur and a creepage distance from the wafer W to the cooling plate 30 through between the male thread portion 52a and the female thread portion 24b is increased, as compared to when no thread is provided. Thus, electrical discharge in the area can be sufficiently prevented.

The upper surface of the first porous member 51 of the porous plug 50 is located at a position lower than the upper surface of the small circular projections 21b. Therefore, the wafer W is not lifted by the upper surface of the first porous member 51.

In addition, an upper surface 51a of the first porous member 51 of the porous plug 50 is at the same height as the reference surface 21c of the wafer placement surface 21. Thus, the height of the space between the lower surface of the wafer W and the upper surface 51a of the first porous member 51 is maintained at a low level. Therefore, it is possible to prevent arc discharge from occurring in the space.

Still furthermore, the gas hole 34 is provided with the insulating pipe 60, thus the creepage distance between the wafer W and the cooling plate 30 is increased. Therefore, occurrence of creeping discharge (spark discharge) in the porous plug 50 can be prevented.

The present invention is not limited to the above-described embodiment, and can be carried out by various modes as long as they belong to the technical scope of the invention.

Figure 6A:
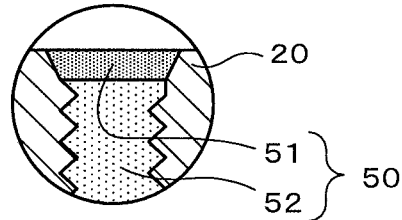
FIGS. 6A to 6C are each a vertical cross-sectional view of another example of a porous plug 50.
Figure 6B:
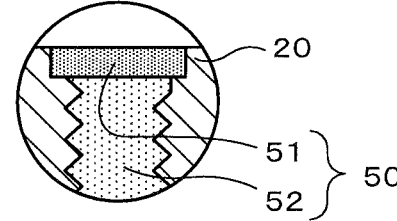
Figure 6C:
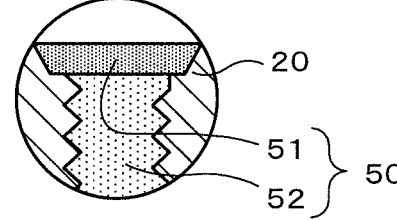

In the above embodiment, the first porous member 51 has a circular plate shape with an upper base and a lower base in the same size which is the same as the upper surface of the second porous member 52; however, the shape of the first porous member 51 may be as illustrated in FIGS. 6A to 6C. The first porous member 51 of FIG. 6A has an inverted circular truncated cone shape with an upper base larger than a lower base which is the same in size as the upper surface of the second porous member 52. In this case, as compared to the above embodiment, the area of the outer peripheral surface of the first porous member 51 is increased, thus the adhesiveness between the outer peripheral surface of the first porous member 51 and the ceramic plate 20 is more favorable. The first porous member 51 of FIG. 6B has a circular plate shape with an upper base and a lower base in the same size which is larger than the upper surface of the second porous member 52. In this case, the adhesiveness between the first porous member 51 and the second porous member 52 as well as the adhesiveness between the first porous member 51 and the ceramic plate 20 are more favorable than in the above embodiment. The first porous member 51 of FIG. 6C has an inverted circular truncated cone shape with an upper base larger than a lower base which is larger than the upper surface of the second porous member 52. In this case, the adhesiveness between the first porous member 51 and the second porous member 52 as well as the adhesiveness between the first porous member 51 and the ceramic plate 20 are more favorable than in the above embodiment.

Particularly, when the first porous member 51 is formed by thermal spray, the shape of the first porous member 51 is more preferable in FIG. 6A than in the above embodiment, more preferable in FIG. 6B than in FIG. 6A, and more preferable in FIG. 6C than in FIG. 6B. Furthermore, in FIGS. 6A to 6C, the diameter of the upper base of the first porous member 51 is larger than in the above embodiment, thus a gas is likely to flow.

Figure 7:
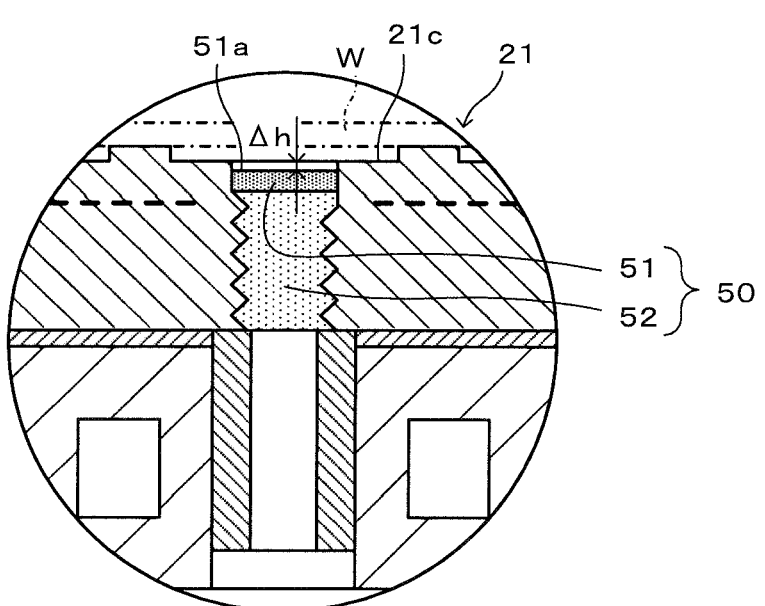
FIG. 7 is a vertical cross-sectional view of another example of the porous plug 50.

In the above embodiment, the upper surface 51a of the first porous member 51 of the porous plug 50 is at the same height as the reference surface 21c of the wafer placement surface 21; however, the configuration is not limited thereto. For example, as illustrated in FIG. 7, a difference Δh obtained by subtracting the height of the upper surface 51a of the first porous member 51 from the height of the reference surface 21c of the wafer placement surface 21 may be in a range of 0.5 mm or less (preferably 0.2 mm or less, more preferably 0.1 mm or less). In other words, the upper surface 51a of the first porous member 51 may be disposed at a position lower than the reference surface 21c of the wafer placement surface 21 in a range of 0.5 mm or less (preferably 0.2 mm or less, more preferably 0.1 mm or less). Even in this configuration, the height of the space between the lower surface of the wafer W and the upper surface 51a of the first porous member 51 is maintained at a relatively low level. Therefore, it is possible to prevent arc discharge from occurring in the space.

Figure 8:
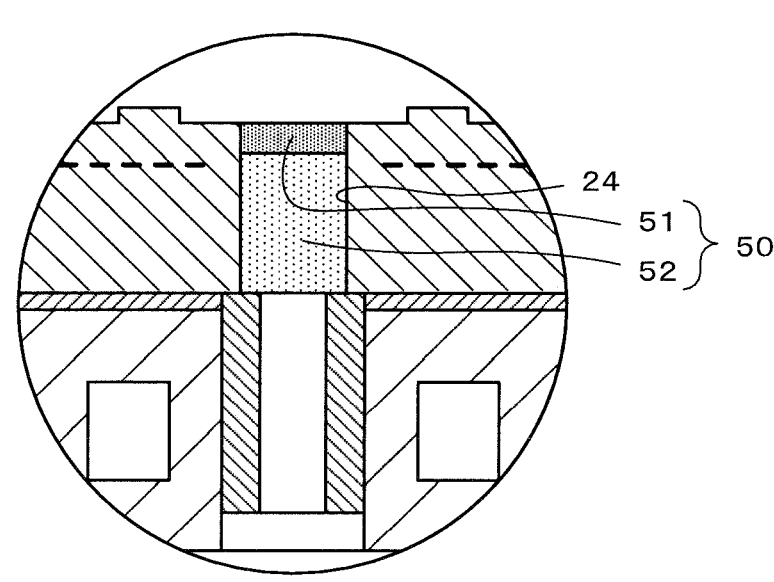
FIG. 8 is a vertical cross-sectional view of another example of the porous plug 50.

In the above embodiment, the male thread portion 52a is formed on the outer peripheral surface of the second porous member 52, the female thread portion 24b is formed on the inner peripheral surface of the plug insertion hole 24, and the male thread portion 52a is screwed into the female thread portion 24b; however, the configuration is not limited thereto. For example, as illustrated in FIG. 8, the male thread portion 52a may not be formed on the outer peripheral surface of the second porous member 52, and the female thread portion 24b may not be formed on the inner peripheral surface of the plug insertion hole 24. In this case, the outer peripheral surfaces of the first and second porous members 51, 52, and the inner peripheral surface of the plug insertion hole 24 may be bonded by a bonding adhesive (an organic bonding adhesive or an inorganic bonding adhesive may be used). However, it is difficult to fill the space between the outer peripheral surfaces of the first and second porous members 51, 52, and the inner peripheral surface of the plug insertion hole 24 with a bonding adhesive without creating a gap. When a gap is created, electric discharge may occur in the gap. Thus, the structure of the above embodiment is more preferable than the structure of FIG. 8.

Figure 9:
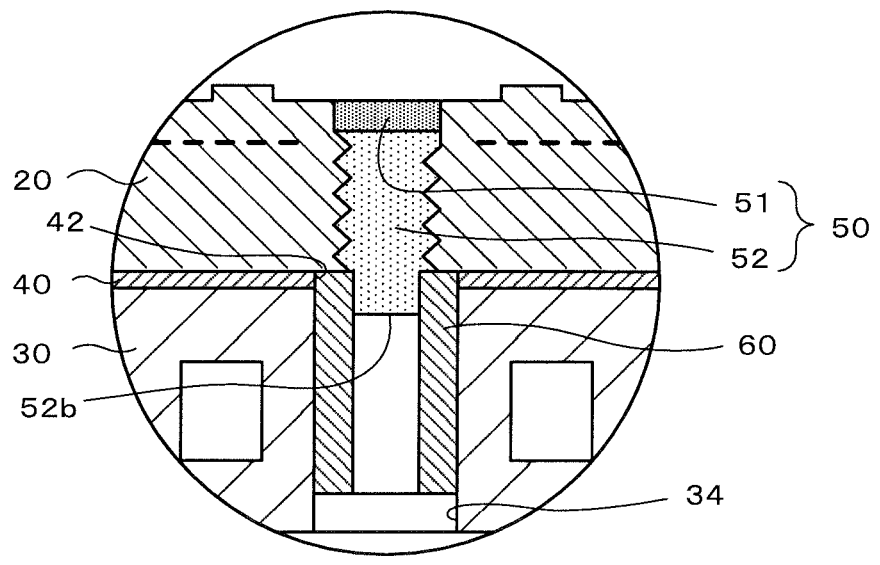
FIG. 9 is a vertical cross-sectional view of another example of the porous plug 50.

In the above embodiment, the lower surface of the second porous member 52 conforms the lower surface of the ceramic plate 20; however, the configuration is not limited thereto. For example, as illustrated in FIG. 9, a lower surface 52b of the second porous member 52 may be located inside the insulation pipe 60. In other words, the lower surface 52b of the second porous member 52 may be located inside the communication hole (the circular hole 42 and the gas hole 34) of the conductive substrate (the metal joining layer 40 and the cooling plate 30). In this configuration, it is possible to prevent arc discharge from occurring between the lower surface 52b of the second porous member 52 and the conductive substrate. This is because arc discharge occurs due to a potential difference between the lower surface 52b of the second porous member 52 and the conductive substrate when the lower surface 52b of the second porous member 52 is located above the upper surface (the upper surface of the metal joining layer 40) of the conductive substrate, but with the configuration as in FIG. 9, such electric discharge does not occur.

Figure 10A:
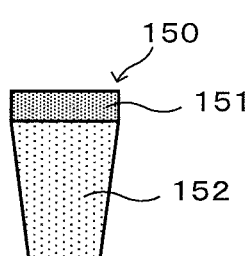
FIGS. 10A to 10G are vertical cross-sectional views of porous plugs 150 to 750.
Figure 10E:
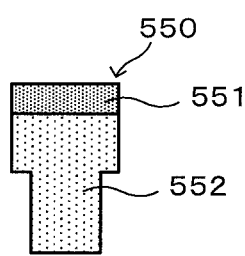
Figure 10B:
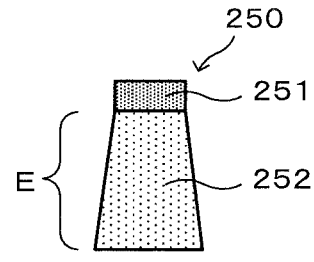
Figure 10F:
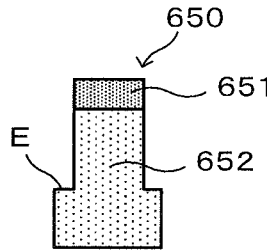
Figure 10C:
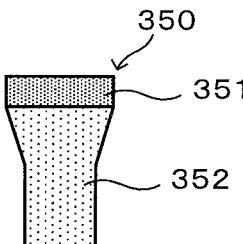
Figure 10G:
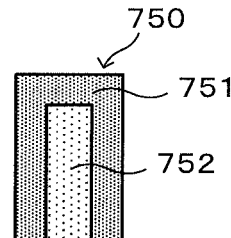
Figure 10D:
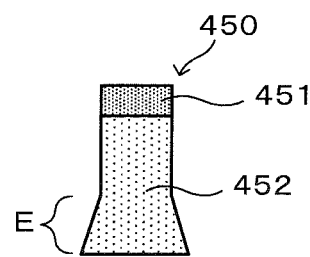

Instead of the porous plug 50 of the above embodiment, porous plugs 150 to 750 illustrated in FIG. 10A to FIG. 10G may be used. When these porous plugs 150 to 750 are used, respective plug insertion holes 24 provided in the ceramic plate 20 are changed to corresponding shapes. The porous plug 150 of FIG. 10A is such that a circular plate-shaped first porous member 151 is provided on a second porous member 152 in an inverted circular truncated cone shape with an upper base larger than a lower base. The porous plug 250 of FIG. 10B is such that a circular plate-shaped first porous member 251 is provided on a second porous member 252 in a circular truncated cone shape with a lower base larger than an upper base. The porous plug 350 of FIG. 10C is such that a circular plate-shaped first porous member 351 is provided on a second porous member 352 in a shape with a cylinder connected to the lower surface of an inverted circular truncated cone. The porous plug 450 of FIG. 10D is such that a circular plate-shaped first porous member 451 is provided on a second porous member 452 in a shape with a cylinder connected to the upper surface of a circular truncated cone. The porous plug 550 of FIG. 10E is such that a circular plate-shaped first porous member 551 is provided on a second porous member 552 in a shape with a small-diameter cylinder connected to the lower surface of a large-diameter cylinder. The porous plug 650 of FIG. 10F is such that a circular plate-shaped first porous member 651 is provided on a second porous member 652 in a shape with a large-diameter cylinder connected to the lower surface of a small-diameter cylinder. The porous plug 750 of FIG. 10G is such that a first porous member 751 in a bottomed cylindrical shape (cup shape) is provided so as to cover the upper surface and the lateral surface of a second porous member 752 in a cylindrical shape. Of these, the second porous members 252, 452, 652 of the porous plugs 250, 450, 650 each have an enlarged-diameter section E a diameter of which increases downward from top. Thus, even when the pressure of a gas flowing upward from below the porous plugs 250, 450, 650 is applied thereto, the enlarged-diameter section E is brought into firm contact with the inner peripheral surface of the plug insertion hole, thus the porous plugs 250, 450, 650 can be prevented from floating. The outer peripheral surfaces of these porous plugs 150 to 750 may be each provided with a male thread portion which is to be screwed into a female thread portion of a plug insertion hole as in the above embodiment.

In the above embodiment, the insulating pipe 60 is provided; however, the insulating pipe 60 may be omitted. Alternatively, instead of providing the cooling plate 30 with the gas hole 34, a gas channel structure may be provided. As the gas channel structure, a structure may be adopted which includes: a ring section provided inside the cooling plate 30 and concentric therewith in a plan view; an introduction section for introducing a gas from the rear surface of the cooling plate 30 to the ring section; and a distribution section (corresponding to the above-described gas hole 34) that distributes a gas from the ring section to each porous plug 50. The number of introduction sections may be smaller than the number of distribution sections, and may be one, for example.

In the above embodiment, the first porous member 51 is a thermal spray film, but the first porous member 51 is not limited to a thermal spray film. For example, the first porous member 51 may be a porous bulk body. In this case, a male thread portion may be provided on the outer peripheral surface of the porous bulk body included in the first porous member 51, a female thread portion may be provided in an upper portion of the inner peripheral surface of the plug insertion hole 24, and both may be screwed together. Alternatively, the first porous member 51 may be produced by laser sintering.

In the above embodiment, an electrostatic electrode is illustrated as the electrode 22 to be embedded in the ceramic plate 20; however, the configuration is not limited thereto. For example, in replacement of or in addition to the electrode 22, a heater electrode (resistance heating element) may be embedded in the ceramic plate 20, or an RF electrode may be embedded therein.

In the above embodiment, the ceramic plate 20 and the cooling plate 30 are joined by the metal joining layer 40; however, a resin adhesive layer may be used in replacement of the metal joining layer 40. In this case, the cooling plate 30 corresponds to the conductive substrate of the present invention.

The present application claims priority from Japanese Patent Application No. 2022-007944 filed Jan. 21, 2022, the entire contents of which are incorporated herein by reference.

What is claimed is:

1. A member for semiconductor manufacturing apparatus, comprising:
a ceramic plate having a wafer placement surface on its upper surface; and
a porous plug that is disposed in a plug insertion hole penetrating the ceramic plate in an up-down direction, and allows a gas to flow,
a conductive substrate provided in a lower surface of the ceramic plate,
a communication hole provided in the conductive substrate to communicate with the porous plug, and
an insulating pipe bonded to an inner peripheral surface of the communication hole,
wherein the porous plug has a first porous member exposed to the wafer placement surface, and a second porous member having an upper surface completely covered by a lower surface of the first porous member,
the first porous member is higher in purity and smaller in thickness than the second porous member, and
the second porous member is higher in porosity than the first porous member,
and

12 wherein the first porous member is disposed above the second porous member in the up-down direction of the ceramic plate, and
wherein a lower surface of the second porous member is located inside the communication hole.

2. The member for semiconductor manufacturing apparatus according to claim 1,
wherein the first porous member is a thermal spray film.

3. The member for semiconductor manufacturing apparatus according to claim 1,
wherein the plug insertion hole has a female thread portion on an inner peripheral surface, and the porous plug has a male thread portion to be screwed into the female thread portion, on an outer peripheral surface.

4. The member for semiconductor manufacturing apparatus according to claim 1,
wherein the first porous member has an inverted circular truncated cone shape with an upper base larger than a lower base.

5. The member for semiconductor manufacturing apparatus according to claim 1,
wherein the second porous member has an enlarged-diameter section a diameter of which increases downward from top.

6. The member for semiconductor manufacturing apparatus according to claim 1,
wherein the wafer placement surface has a large number of small projections that support a wafer, and
an upper surface of the first porous member of the porous plug is located at a position lower than an upper surface of the small projections.

7. The member for semiconductor manufacturing apparatus according to claim 6,
wherein the upper surface of the first porous member of the porous plug is at a same height as or at a position lower than a reference surface of the wafer placement surface, in a range of 0.5 mm or less, the reference surface being not provided with the small projections.

8. The member for semiconductor manufacturing apparatus according to claim 1,
wherein the second porous member is not exposed to the wafer placement surface.

9. The member for semiconductor manufacturing apparatus according to claim 8,
wherein the second porous member is completely enclosed within the ceramic plate.

10. The member for semiconductor manufacturing apparatus according to claim 1,
wherein the lower surface of the second porous member is in contact with the insulating pipe.

* * * * *